(12) United States Patent
Heinze et al.

(10) Patent No.: US 7,636,026 B2
(45) Date of Patent: Dec. 22, 2009

(54) BULK ACOUSTIC WAVE RESONATOR AND FILTER

(75) Inventors: Habbo Heinze, Weilim Schönbuch (DE); Edgar Schmidhammer, Stein (DE)

(73) Assignee: EPCOS AG, Munich (DE)

( * ) Notice: Subject to any disclaimer, the term of this patent is extended or adjusted under 35 U.S.C. 154(b) by 243 days.

(21) Appl. No.: 11/830,415

(22) Filed: Jul. 30, 2007

(65) Prior Publication Data

US 2008/0094154 A1    Apr. 24, 2008

(30) Foreign Application Priority Data

Aug. 1, 2006    (DE)    ........................ 10 2006 035 874

(51) Int. Cl.
*H03H 9/56* (2006.01)
(52) U.S. Cl. ...................................................... 333/189
(58) Field of Classification Search ................. 333/188, 333/189
See application file for complete search history.

(56) References Cited

U.S. PATENT DOCUMENTS

| | | | |
|---|---|---|---|
| 6,812,619 B1 * | 11/2004 | Kaitila et al. ............... | 310/320 |
| 6,927,649 B2 | 8/2005 | Metzger et al. | |
| 6,992,400 B2 | 1/2006 | Tikka et al. | |
| 7,102,460 B2 | 9/2006 | Schmidhammer et al. | |
| 7,187,109 B2 | 3/2007 | Tikka et al. | |
| 7,280,007 B2 * | 10/2007 | Feng et al. .................. | 333/187 |
| 7,349,717 B2 | 3/2008 | Block et al. | |
| 7,385,467 B2 | 6/2008 | Stoemmer et al. | |
| 7,388,454 B2 * | 6/2008 | Ruby et al. ................. | 333/187 |
| 7,489,067 B2 | 2/2009 | Metzger et al. | |
| 7,541,717 B2 | 6/2009 | Schmidhammer | |
| 2003/0227357 A1 | 12/2003 | Metzger et al. | |
| 2004/0257172 A1 | 12/2004 | Schmidhammer et al. | |
| 2005/0082951 A1 | 4/2005 | Tikka et al. | |
| 2005/0167854 A1 | 8/2005 | Tikka et al. | |
| 2006/0091975 A1 | 5/2006 | Schmidhammer et al. | |
| 2006/0103492 A1 | 5/2006 | Feng et al. | |
| 2006/0164183 A1 | 7/2006 | Tikka et al. | |
| 2006/0164186 A1 | 7/2006 | Stoemmer et al. | |
| 2006/0194550 A1 | 8/2006 | Block et al. | |
| 2007/0103037 A1 | 5/2007 | Metzger et al. | |
| 2007/0205850 A1 * | 9/2007 | Jamneala et al. ............ | 333/187 |
| 2007/0296513 A1 | 12/2007 | Ruile et al. | |
| 2007/0296521 A1 | 12/2007 | Schmidhammer | |
| 2008/0042780 A1 * | 2/2008 | Lee et al. .................... | 333/187 |
| 2008/0068109 A1 | 3/2008 | Schmidhammer | |
| 2008/0084136 A1 | 4/2008 | Schmidhammer | |
| 2008/0094154 A1 | 4/2008 | Heinze et al. | |

(Continued)

FOREIGN PATENT DOCUMENTS

WO    WO01/06647    1/2001

*Primary Examiner*—Benny Lee
*Assistant Examiner*—Alan Wong
(74) *Attorney, Agent, or Firm*—Fish & Richardson P.C.

(57) ABSTRACT

A bulk acoustic wave resonator includes an acoustically active area where an acoustic wave is excitable, and a transition area adjacent to an outside edge of the acoustically active area. A critical frequency of the acoustic wave in the transition area differs from a critical frequency of the acoustic wave in the active area. The transition area includes an additional layer. The bulk acoustic wave resonator includes electrodes for electrically connecting to electrical supply lines. The additional layer is irregular in areas adjacent to junction areas between the electrical supply lines and the resonator.

20 Claims, 3 Drawing Sheets

U.S. PATENT DOCUMENTS

| | | |
|---|---|---|
| 2008/0136555 A1 | 6/2008 | Schmidhammer |
| 2008/0246556 A1 | 10/2008 | Heinze et al. |
| 2008/0258845 A1 | 10/2008 | Schmidhammer |
| 2008/0272853 A1 | 11/2008 | Heinze et al. |
| 2009/0002098 A1 | 1/2009 | Mayer et al. |
| 2009/0009262 A1 | 1/2009 | Schmidhammer et al. |
| 2009/0079521 A1 | 3/2009 | Heinze et al. |
| 2009/0093270 A1 | 4/2009 | Block et al. |

* cited by examiner

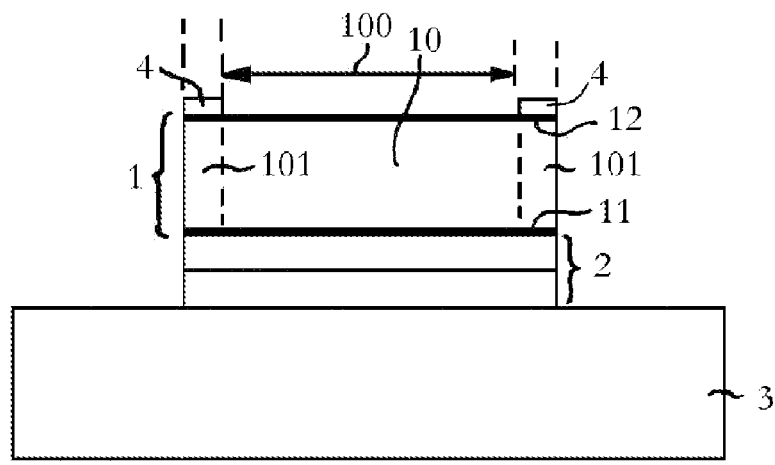
FIG. 1
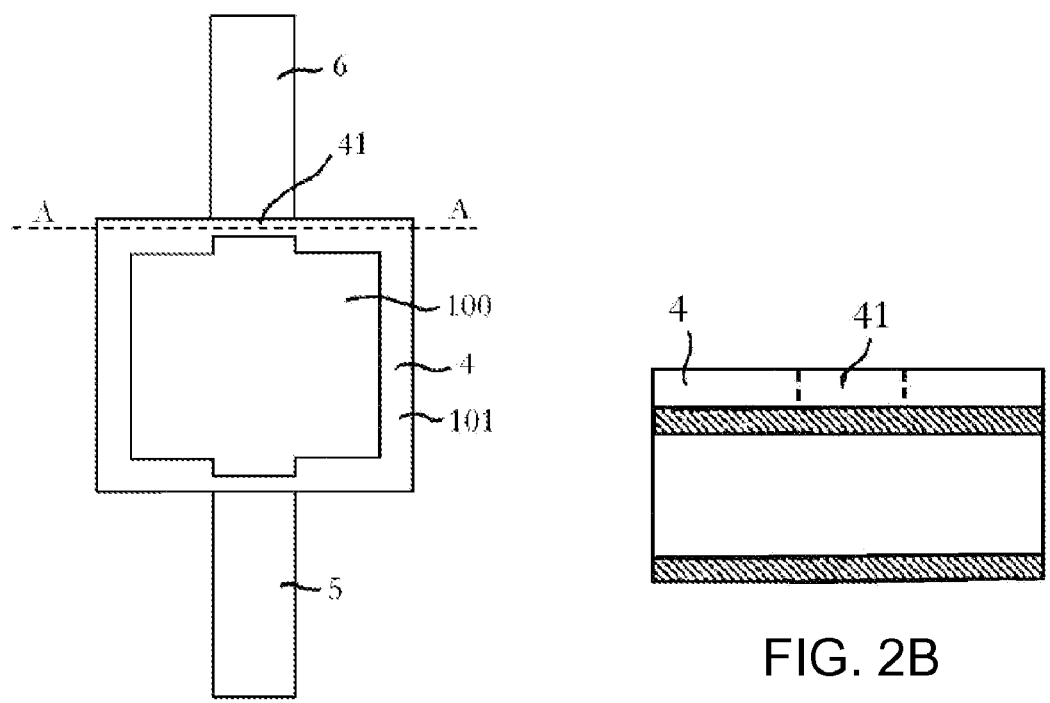
FIG. 2A
FIG. 2B

BULK ACOUSTIC WAVE RESONATOR AND FILTER

CLAIM TO PRIORITY

This patent application claims priority to German Patent Application No. 102006035874.0, which was filed on Aug. 1, 2006. The contents of German Patent Application No. 102006035874.0 are hereby incorporated by reference into this patent application as if set forth herein in full.

BACKGROUND

WO 01/06647 describes a bulk acoustic wave resonator.

SUMMARY

The quality of a bulk acoustic wave resonator can be increased by improving boundary conditions for acoustic waves excited in the resonator such that energy loss resulting from waves escaping from the resonator is reduced. Boundary conditions may be altered in areas that border supply lines to the resonator.

A bulk acoustic wave resonator is described that includes an acoustically active area in which an acoustic wave can be excited, and a transition area that is adjacent to the acoustically active area, in which a critical frequency of the acoustic wave differs from that in the active area. Electrical supply lines are connected to the resonator and/or its electrode layers. The transition area comprises an additional layer, which has irregularities in areas near junctions between the electrical supply lines and the resonator.

The additional layer may have a width or thickness in areas adjacent to the junction areas that is different than the width or thickness of the additional layer in other areas. In this example, the width is measured in the longitudinal direction of the supply line. The width of an irregularity that is measured perpendicular to the supply line may have the same width as the supply line.

The width and/or thickness of the additional layer in areas adjacent to the junction areas may be less than the thickness of the additional layer in its other areas. The additional layer can also be broader and/or thicker in areas adjoining the junction areas of the supply lines than in the other areas.

The width difference of the additional layer in the junction areas and outside of these areas in a single resonator can be, for instance, at least 0.3 µm or least 0.5 µm.

The thickness difference of the additional layer in the junction areas and outside of these areas in a single resonator can be, for instance, at least 5 nm or at least 10 nm.

A critical frequency of an acoustic wave is the frequency at which the acoustic fundamental mode is excited. The wavelength of the acoustic wave excited at the critical frequency is essentially twice the acoustic thickness of the resonator.

The transition area serves as a potential well for adjusting a rectangular wave profile in the active area. With the transition area, it is possible to create favorable boundary conditions for the wave mode to be excited and for attenuating undesired lateral acoustic modes. Thus resonator quality thus can be increased.

In junction areas of supply lines to the resonator, different boundary conditions exist for the acoustic wave than in other areas. Energy losses can result from the escape of lateral modes in the direction of the supply lines. By modifying the transition area . . . in particular the thickness or the width of the additional layer in the junction areas . . . it is possible to create enhanced boundary conditions for the acoustic wave along the entire periphery of the resonator.

The additional layer may be constructed as a frame. The frame can be arranged on an upper electrode of the resonator. The frame can also be arranged underneath the upper electrode of the resonator.

The additional layer may comprise at least one electrically insulating layer made, for instance, of silicon dioxide. In addition, the additional layer can comprise at least one conductive layer.

The thickness of the additional layer can be between 20 nm and 80 nm, for example. This applies, for example, to a design in which only one electrode of the resonator comprises, in addition to an aluminum layer, a heavy layer, having a specific density that exceeds the specific density of Al by at least 50%. This can be, for example, a layer of W, Mo, Ru, Pt, etc. If both electrodes of a resonator comprise a heavy layer in addition to an aluminum layer, the thickness of the additional layer may be between 20 nm and 140 nm.

The resonator described herein may be used in an HF-filter or a duplexer.

Also described herein is a filter which comprises series resonators and parallel bulk acoustic wave resonators. The series resonators are arranged in series arms and the parallel resonators are arranged in transverse branches of a ladder-type arrangement connected to reference potential. The parallel resonators can also be arranged in transverse branches that interconnect two signal paths.

Each resonator has an acoustically active area and a transition area adjacent thereto. The transition area has an additional layer. Supply lines are connected to the resonators. Outside of the junction areas of supply lines to corresponding resonators, at least one parameter, such as the thickness or the width of the additional layer, has a different value for the series resonators than the corresponding parameter for the parallel resonators.

The thickness and/or width of the additional layer may be smaller in the series resonators than in the parallel resonators. The width of the additional layer can be smaller for the series resonators by, for example, at least 0.3 µm than for the parallel resonators. The width difference can also be more than 0.5 µm. The width of the additional layer for the series resonators can be, for example, between 2.0 and 3.5 µm. For the parallel resonators, the width of the additional layer can be between 2.5 and 4.5 µm.

The thickness difference of the additional layer for the series and parallel resonators can be, for example, at least 5 nm or at least 10 nm.

For at least one of the series resonators and the parallel resonators, the additional layer may have a different width and/or thickness in areas adjoining the junction areas of the supply lines than in its other areas.

Example of resonators are described below with respect to the figures.

DESCRIPTION OF THE DRAWINGS

FIG. 1 shows a cross-section of a bulk acoustic wave resonator.

FIG. 2A shows a plan view of a bulk acoustic wave resonator with an additional layer having a reduced width in junction areas to electrical supply lines.

FIG. 2B shows the bulk acoustic wave resonator of FIG. 2A in cross section.

DETAILED DESCRIPTION

Figure 3A:
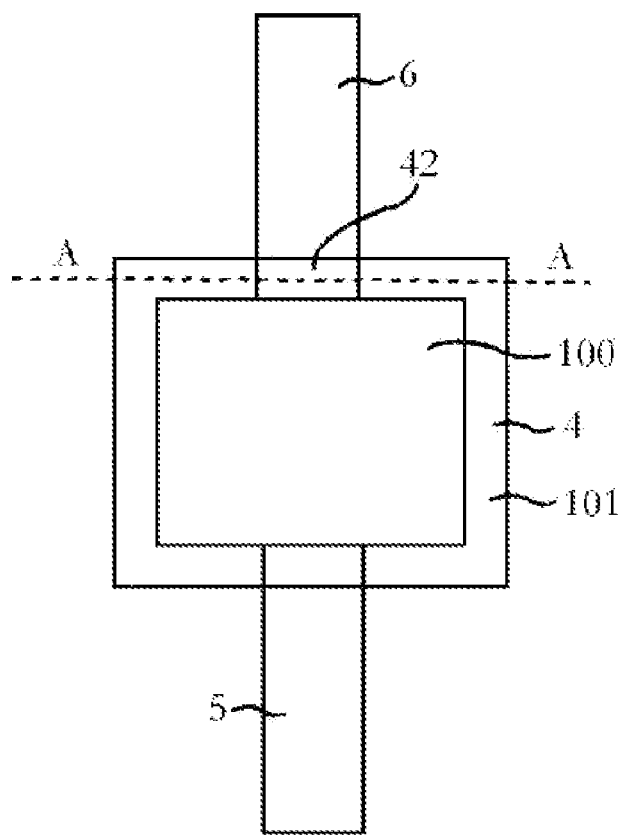
FIG. 3A shows a plan view of a bulk acoustic wave resonator with an additional layer having a reduced thickness in junction areas to electrical supply lines.

FIG. 1 shows a resonator which comprises a resonator area 1 and an acoustic mirror 2. The resonator is located on a carrier substrate 3. Acoustic mirror 2 is arranged between resonator area 1 and carrier substrate 3.

Resonator area 1 comprises electrodes 11, 12 and a piezoelectric layer 10 arranged between them. The resonator area is divided into an acoustically active area 100, in which a bulk acoustic wave is excited, and a transition area 101 adjacent to the active area. Active area 100 may occupy only a (centrally arranged) region of the surface area of the resonator. The boundary region of this surface area comprises transition area 101.

Transition area 101 differs from active area 100 with respect to structure in that transition area 101 comprises an additional layer 4. Layer 4 is located in the boundary region of resonator area 1, e.g., on upper electrode 12. Additional layer 4 may be limited to transition area 101. For example, active area 100 may be free of the additional layer.

Additional layer 4 may be constructed in the form of a frame. A layer sequence with the additional layer is distinguished from a layer sequence without the additional layer by a lower critical frequency.

At least one supply line 5, 6 is connected to each electrode 11, 12 of the resonator, as shown in FIG. 2A.

FIGS. 2A and 2B show different views of parts of a resonator with an additional layer 4. The width of additional layer 4 is reduced in areas 41 adjoining junction areas of supply lines 5, 6. In FIG. 2B, a cross section along line AA (of FIG. 2A) is shown.

Figure 3B:
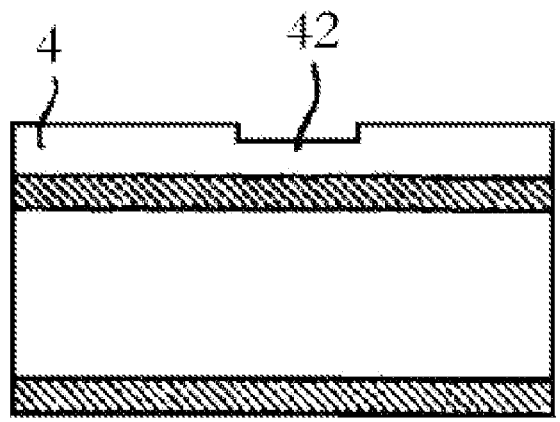
FIG. 3B shows the bulk acoustic wave resonator of FIG. 3A in cross section.

FIGS. 3A and 3B show different views of a resonator with an additional layer 4. The thickness of additional layer 4 is reduced in areas 42 adjoining junction areas of supply lines 5, 6. FIG. 3B shows a cross-section along line AA of the resonator shown in FIG. 3A.

Different thickness ranges of additional layer 4 can be obtained by applying a second sublayer to the first sublayer outside of areas 42. Alternatively, it is possible to etch additional layer 4 in areas 42 to a predetermined depth.

In area 42, the width of the additional layer 4 can be also changed along with the thickness.

There is the possibility of increasing the thickness and/or the width of additional layer 4 in areas 41, 42.

Figure 4A:
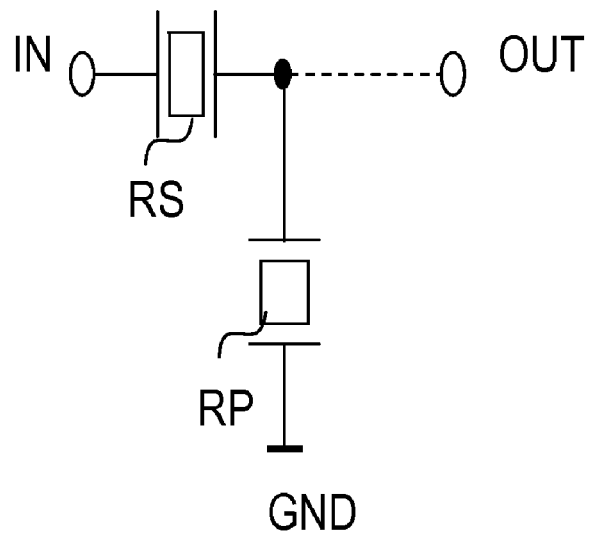
FIGS. 4A and 4B show filter arrangements that include bulk acoustic wave resonators.

FIG. 4A shows a filter having a ladder-type arrangement. The filter comprises a series arm connecting an input IN and an output Out. At least one series resonator RS is arranged in the series arm.

A parallel resonator RP is arranged in a branch transverse to the series arm, which connects the series arm to a reference potential, which is ground GND in this example. The filter may comprise additional series resonators arranged in the series arm and additional transverse branches, which is/are indicated by the broken line.

Figure 4B:
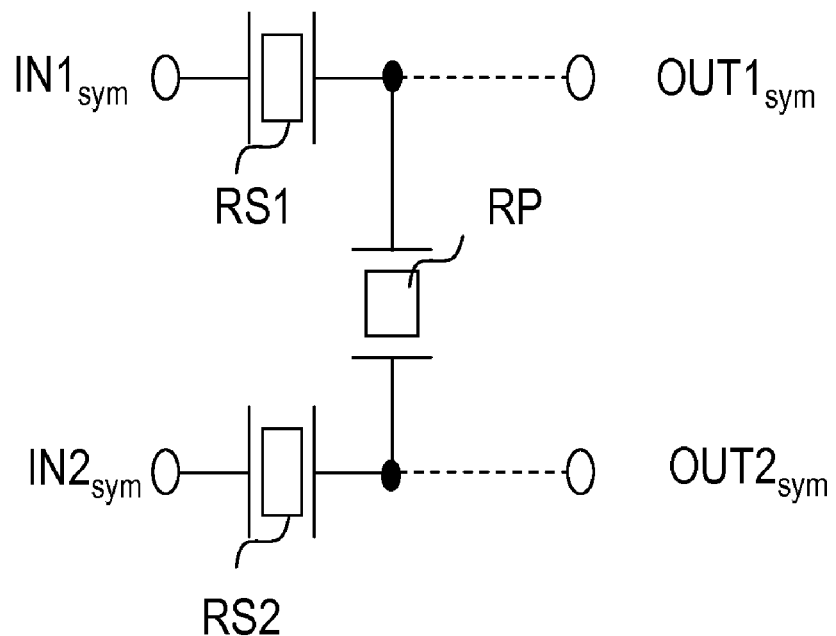

FIG. 4B shows another ladder-type arrangement which is useful for symmetric signals and balanced operation. There are two series arms connecting symmetric inputs IN1*sym*, IN2*sym* to symmetric outputs Out1*sym*, OUT2*sym*. A transverse branch interconnects the two series arms. There may be additional series resonators in the series arms and additional transversal branches interconnecting the series arms.

Components of different embodiments described herein may be combined to form other embodiments not specifically set forth above. Other embodiments not specifically described herein are also within the scope of the following claims.

What is claimed is:

1. A bulk acoustic wave resonator, comprising:
    an acoustically active area where an acoustic wave is excitable;
    a transition area adjacent to an outside edge of the acoustically active area, the transition area comprising an additional layer; and
    electrodes to electrically connect to electrical supply lines;
    wherein the additional layer is irregular in areas adjacent to junction areas between the electrical supply lines and the bulk acoustic wave resonator; and
    wherein a critical frequency of the acoustic wave in the transition area differs from a critical frequency of the acoustic wave in the active area.

2. The bulk acoustic wave resonator of claim 1, wherein, in the areas adjacent to the junction areas, the additional layer has a width that is different from a width of the additional layer in areas that are not adjacent to the junction areas; and
    wherein the width in the areas adjacent to junction areas is measured in a longitudinal direction of the supply lines.

3. The bulk acoustic wave resonator of claim 1, wherein, in the areas adjacent to the junction areas, the additional layer has a thickness that is different from a thickness of the additional layer in areas that are not adjacent to the junction areas.

4. The bulk acoustic wave resonator of claim 3, wherein the thickness of the additional layer is between 20 nm and 80 nm.

5. The bulk acoustic wave resonator of claim 1, wherein the electrodes comprise two electrodes, each of the two electrodes comprising a conductive layer having a specific density that exceeds a specific density of Al by at least 50%; and
    wherein a thickness of the additional layer is between 20 nm and 140 nm.

6. The bulk acoustic wave resonator of claim 1, wherein the additional layer comprises silicon dioxide.

7. The bulk acoustic wave resonator of claim 1, wherein an irregularity of the additional layer in one of the areas adjacent to one of the junction areas has a width that corresponds to a width of one of the electrical supply lines.

8. The bulk acoustic wave resonator of claim 1, wherein the additional layer is frame-shaped.

9. The bulk acoustic wave resonator of claim 2, wherein, in the areas adjacent to the junction areas, the additional layer has a thickness that is different from a thickness of the additional layer in areas that are not adjacent to the junction areas.

10. The bulk acoustic wave resonator of claim 9, wherein the additional layer comprises silicon dioxide.

11. The bulk acoustic wave resonator of claim 3, wherein, in the areas adjacent to the junction areas, the additional layer has a width that is different from a width of the additional layer in areas that are not adjacent to the junction areas.

12. The bulk acoustic wave resonator of claim 11, wherein the additional layer comprises silicon dioxide.

13. The bulk acoustic wave resonator of claim 1, further comprising:
    a piezoelectric layer between the electrodes; and
    an acoustic mirror below the electrodes and the piezoelectric layer.

14. A filter comprising:
    series bulk acoustic wave resonators; and
    parallel bulk acoustic wave resonators;

wherein each of the series bulk acoustic wave resonators and each of the parallel bulk acoustic wave resonators comprises:
- an acoustically active area where an acoustic wave is excitable;
- a transition area adjacent to an outside edge of the acoustically active area, the transition area comprising an additional layer; and
- electrodes to electrically connect to electrical supply lines;
- wherein the additional layer is irregular in areas adjacent to junction areas between the electrical supply lines and the resonator; and
- wherein a critical frequency of the acoustic wave in the transition area differs from a critical frequency of the acoustic wave in the active area; and
- wherein a size of a first irregularity in an additional layer in a series bulk acoustic wave resonator is different than a size of a second irregularity in an additional layer in a corresponding parallel bulk acoustic wave resonator.

15. The filter of claim 14, wherein the first and second irregularities comprise a same type of irregularity.

16. The filter of claim 14, wherein the first and second irregularities comprise thicknesses of the additional layers in the series bulk acoustic wave resonator and in the parallel bulk acoustic wave resonator.

17. The filter of claim 14, wherein the first and second irregularities comprise widths of additional layers in the series bulk acoustic wave resonator and in the parallel bulk acoustic wave resonator.

18. A bulk acoustic wave resonator, comprising:
- an acoustically active area where an acoustic-wave is excitable;
- a transition area adjacent to an outside edge of the acoustically active area, the transition area comprising an additional layer and having a different acoustic property than the acoustically active area; and
- electrodes to electrically connect to electrical supply lines;
- wherein the additional layer is irregular in an area adjacent to a junction area between an electrical supply lines and the bulk acoustic wave resonator.

19. The bulk acoustic wave resonator of claim 18, wherein, in the area adjacent to the junction area, the additional layer has a width that is different from a width of the additional layer in areas that are not adjacent to the junction area.

20. The bulk acoustic wave resonator of claim 18, wherein, in the area adjacent to the junction area, the additional layer has a thickness that is different from a thickness of the additional layer in areas that are not adjacent to the junction area.

\* \* \* \* \*

UNITED STATES PATENT AND TRADEMARK OFFICE
CERTIFICATE OF CORRECTION

| | | |
|---|---|---|
| PATENT NO. | : 7,636,026 B2 | Page 1 of 1 |
| APPLICATION NO. | : 11/830415 | |
| DATED | : December 22, 2009 | |
| INVENTOR(S) | : Habbo Heinze | |

It is certified that error appears in the above-identified patent and that said Letters Patent is hereby corrected as shown below:

Column 4, Claim 1, Line 20:
Insert --acoustically-- before "active area"

Column 4, Claim 10, Line 51:
Delete "hulk" and Insert --bulk--

Column 5, Claim 14, Line 13:
Delete "the" and Insert --a corresponding--

Column 5, Claim 14, Line 16:
Insert --acoustically-- before "active area"

Column 6, Claim 17, Line 2:
Insert --the-- after "of"

Column 6, Claim 18, Line 6:
Delete "acoustic-wave" and Insert --acoustic wave--

Signed and Sealed this

Ninth Day of March, 2010

David J. Kappos
*Director of the United States Patent and Trademark Office*